(12) United States Patent
Komaki et al.

(10) Patent No.: US 10,732,522 B2
(45) Date of Patent: Aug. 4, 2020

(54) IMPRINT APPARATUS AND ARTICLE MANUFACTURING METHOD

(71) Applicant: CANON KABUSHIKI KAISHA, Tokyo (JP)

(72) Inventors: Takamitsu Komaki, Utsunomiya (JP); Yoshiyuki Usui, Utsonomiya (JP); Nozomu Hayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 310 days.

(21) Appl. No.: 15/091,096

(22) Filed: Apr. 5, 2016

(65) Prior Publication Data

US 2016/0299444 A1 Oct. 13, 2016

(30) Foreign Application Priority Data

Apr. 8, 2015 (JP) .................................. 2015-079472

(51) Int. Cl.
*G03F 9/00* (2006.01)
*G03F 7/00* (2006.01)

(52) U.S. Cl.
CPC .......... *G03F 9/7042* (2013.01); *G03F 7/0002* (2013.01)

(58) Field of Classification Search
CPC ............................ G03F 9/7042; G03F 7/0002
See application file for complete search history.

(56) References Cited

U.S. PATENT DOCUMENTS

| | | |
|---|---|---|
| 2010/0309486 A1 | 12/2010 | Numata |
| 2011/0141489 A1 | 6/2011 | Sato |
| 2011/0317163 A1 | 12/2011 | Lee |
| 2012/0200005 A1* | 8/2012 | Sato ........................ B82Y 10/00 264/293 |
| 2013/0090877 A1 | 4/2013 | Nagai |
| 2014/0346700 A1 | 11/2014 | Sato et al. |

FOREIGN PATENT DOCUMENTS

| | | |
|---|---|---|
| CN | 104170055 A | 11/2014 |
| CN | 104181768 A | 12/2014 |
| CN | 104238263 A | 12/2014 |
| JP | H03-151624 A | 6/1991 |
| JP | H09-293674 A | 11/1997 |
| JP | H11-340133 A | 12/1999 |
| JP | 2006-294854 A | 10/2006 |
| JP | 2011-249567 A | 12/2011 |
| JP | 2014-203935 A | 10/2014 |
| JP | 2014-229883 A | 12/2014 |
| WO | 2007-123249 A2 | 11/2007 |

* cited by examiner

*Primary Examiner* — Robert J Grun
(74) *Attorney, Agent, or Firm* — Canon U.S.A., Inc. I.P. Division

(57) ABSTRACT

An imprint apparatus for forming a pattern on an imprinting material includes an alignment unit that detects a mold-side mark formed on a mold and a substrate-side mark formed on the substrate, forming a mark pair, and aligns the mold and the substrate on the basis of a detection result. The alignment unit obtains, by using the detection result of a first mark pair and the detection result of a second mark pair, which is different from the first mark pair, positional deviation information of the first mark pair and positional deviation information of the second mark pair in the same direction; obtains a determination value by using the positional deviation information of the first mark pair and the positional deviation information of second mark pair; and determines that mark detection is abnormal when the determination value is not in an allowable range.

27 Claims, 9 Drawing Sheets

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

Optical imprinting is a method for forming a pattern on a substrate. In the optical imprinting, a mold (also referred to as a "mask") on the surface of which a relief is formed is brought into contact with a light-curable resin (imprinting material) applied on a substrate, and light, such as ultraviolet light, is radiated thereon to cure the light-curable resin. Then, by removing the mold from the light-curable resin, a pattern in which high portions and low portions are the reverse of those of the pattern on the mold is formed on the substrate.

Various imprint apparatuses, which vary in the method of curing resin and in purpose, have been proposed. For mass-production apparatuses, such as apparatuses for producing semiconductor devices, the use of step-and-flash imprint lithography (hereinbelow, SFIL) is effective.

Such an imprint apparatus employs a die-by-die alignment method to align the pattern on the mold with a shot area of the substrate. In this method, for each shot area of the substrate, a mold-side mark provided on the mold and a substrate-side mark provided on the substrate are optically detected, and a positional deviation and a shape difference between the pattern on the mold and the shot area of the substrate are corrected.

To maintain the alignment accuracy, the mark waveform obtained by the optical detection needs to approximate the shape of the mark, etc. Japanese Patent Laid-Open No. 2006-294854 discloses an alignment method in which a mark (waveform) the score (indicating the mark waveform likelihood) of which is abnormal is distinguished from a mark (waveform) the score of which is normal, so that only the mark with the normal score is used for alignment.

In an imprint apparatus, sometimes, alignment between the pattern on the mold and the shot area of the substrate is not performed properly, decreasing the alignment accuracy. A cause of this is, for example, an alignment-mark detection fault caused by a foreign particle trapped between a mold-side mark and a substrate-side mark (mark pair).

If the method disclosed in Japanese Patent Laid-Open No. 2006-294854 is applied to such an imprint apparatus, even though the score indicating the mark waveform likelihood is normal, a measurement error (a mark detection fault), i.e., inability to properly measure the position of the alignment marks, may occur, decreasing the alignment accuracy.

SUMMARY OF THE INVENTION

The present invention provides an imprint apparatus that can improve alignment accuracy.

An imprint apparatus is configured to bring an imprinting material on a substrate and a mold into contact with each other to form a pattern on the imprinting material. The apparatus includes an alignment unit that detects a mold-side mark formed on the mold and a substrate-side mark formed on the substrate, forming a mark pair, and aligns the mold and the substrate on the basis of a detection result. The alignment unit obtains, by using the detection result of a first mark pair and the detection result of a second mark pair, which is different from the first mark pair, positional deviation information of the first mark pair and positional deviation information of the second mark pair in the same direction; obtains a determination value by using the positional deviation information of the first mark pair and the positional deviation information of second mark pair; and determines that mark detection is abnormal when the determination value is not in an allowable range. Further features of the present invention will become apparent from the following description of exemplary embodiments with reference to the attached drawings.

DESCRIPTION OF THE EMBODIMENTS

Embodiments of the present invention will be described in detail below with reference to the drawings.

First Embodiment

Referring to FIGS. 1 to 6, an imprint apparatus according to a first embodiment will be described.

Figure 1:
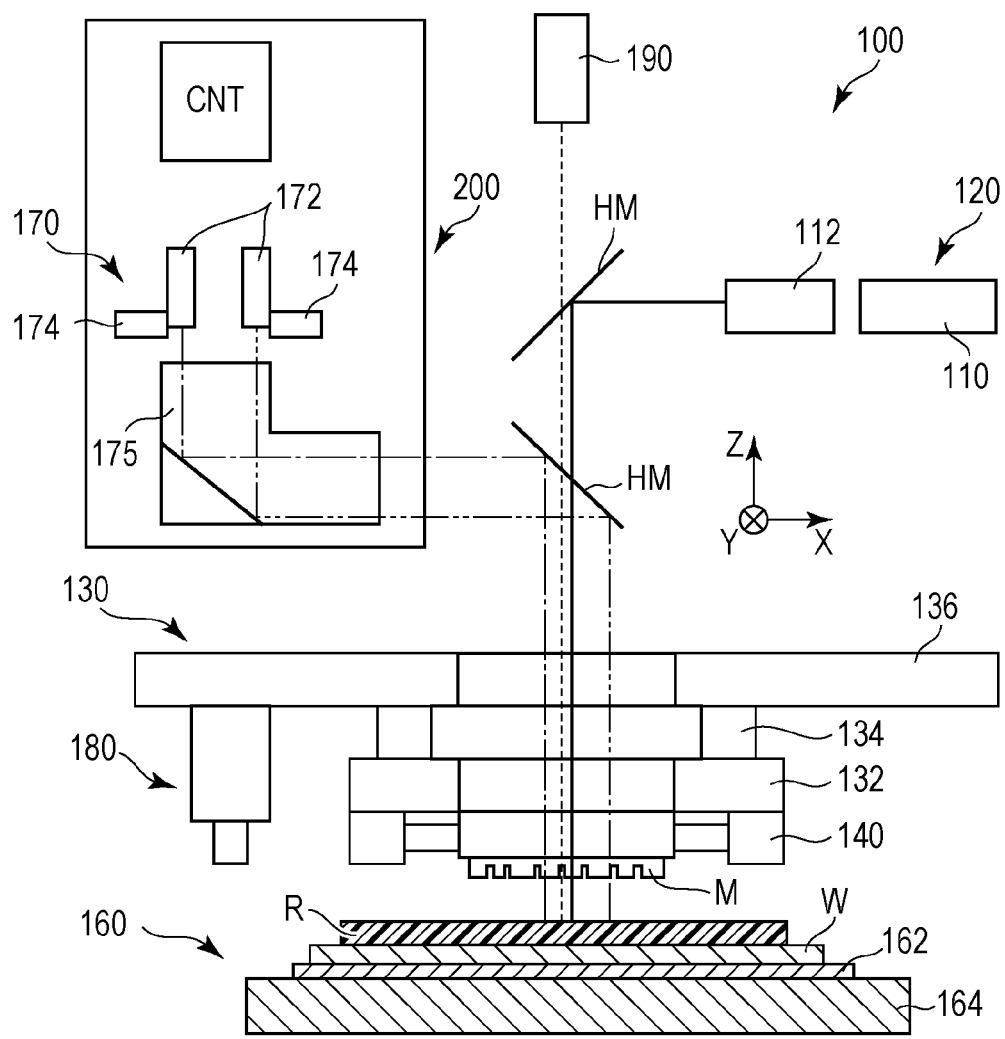
FIG. 1 shows an exemplary configuration of an imprint apparatus according to a first embodiment.

FIG. 1 shows an exemplary configuration of an imprint apparatus according to the first embodiment. The apparatus shown in FIG. 1 is a UV-light-curable imprint apparatus, in which resin (imprinting material) is cured by irradiation with ultraviolet light (UV light). However, the alignment method according to this embodiment is applicable to imprint apparatuses in which resin is cured by irradiation with light of another wavelength range, imprint apparatuses in which resin is cured by another energy, such as heat energy, and the like apparatuses.

An imprint apparatus 100 is configured to form a pattern on multiple shot areas on a substrate by repeating an imprint cycle. Herein, in one imprint cycle, a mold (first object) is pressed against resin, and the resin is cured in this state, thus forming a pattern on one shot area of the substrate (second object). The imprint apparatus 100 may include, for example, a curing part 120, a mold driving part 130, a shape correcting part 140, a driving part 160, a detection part 170, a resin supply part 180, an observation part 190, and a controller CNT. The imprint apparatus 100 also includes a bridge platen for holding the mold driving part 130 and a base platen for holding the driving part 160, which are not illustrated.

The curing part 120 irradiates resin R with UV light through a mold M to cure the resin R. In this embodiment, the resin R is an ultraviolet curable resin. The curing part 120 may include, for example, a light source portion 110 and a first optical system 112. The light source portion 110 may include, for example, a light source, such as a mercury lamp, which generates i-line, g-line, or UV light of another wavelength, and an elliptical mirror for focusing the light generated by the light source. The first optical system 112 may include a lens for radiating light onto the resin R in the shot area to cure the resin R, an aperture, and a half mirror HM. The aperture is used mainly for circumference shielding control. The circumference shielding control restricts the radiation of the UV light onto areas other than the shot area of the substrate W. The first optical system 112 may include an optical integrator for uniformly illuminating the mold M. The light whose circumference is defined by the aperture is incident on the resin R on the substrate W through an image forming system and the mold M.

The mold driving part 130 may include, for example, a mold chuck 132 that holds the mold M, a mold driving mechanism 134 that drives the mold M by driving the mold chuck 132, and a mold base 136 that supports the mold driving mechanism 134. The mold driving mechanism 134 may include a positioning mechanism that controls the position of the mold M with respect to six axes and a mechanism that urges the mold M against the substrate W or the resin R on the substrate and removes the mold M from the cured resin R. Herein, the six axes include X-, Y-, and Z-axes and rotation about these axes in an XYZ coordinate system, in which the support surface for the mold chuck 132 (the surface on which the substrate W is supported) serves as an XY plane and the direction perpendicular thereto is the Z-axis.

The shape correcting part 140 may be mounted to the mold chuck 132. The shape correcting part 140 can correct the shape of the mold M by applying pressure to the mold M from the outer circumference thereof by using, for example, a cylinder that is moved by a fluid, such as air or oil, or a piezoelectric element. The shape correcting part 140 also includes a temperature controller for controlling the temperature of the mold M and can correct the shape of the mold M by controlling the temperature of the mold M. The substrate W may be deformed (typically, expanded or contracted) through a process, such as heat processing. The shape correcting part 140 corrects the shape of the mold M such that the alignment accuracy falls within the allowable range, in response to the deformation of the substrate W.

The driving part 160 may include, for example, a substrate chuck 162 (substrate holder) that holds the substrate W by suction, a substrate stage 164 that moves the substrate W by holding and moving the substrate chuck 162, and a stage driving mechanism (not shown). The stage driving mechanism may include a positioning mechanism that controls the position of the substrate W by controlling the position of the substrate stage 164 with respect to the aforementioned six axes.

The detection part 170 may include, for example, alignment scopes 172, alignment stage mechanisms 174, and a second optical system 175. The alignment scopes 172 detect, through the mold M, alignment marks formed on the mold M and alignment marks formed on the substrate W. The alignment scopes 172 may each include an automatic adjustment scope (AAS), which itself moves and enables the relative position of the mold M and the substrate W to be observed at a desired position within a predetermined area. The alignment scopes 172 may further include an image pickup element that picks up an image by detecting light and converting the light into an electric charge. The alignment stage mechanisms 174 determine the positions of the alignment scopes 172. The second optical system 175 may include a lens for adjusting the optical paths of the alignment scopes 172, an aperture, a mirror, a half mirror HM, etc.

The resin supply part 180 may include, for example, a tank containing the resin R; a nozzle for discharging the resin R, supplied from the tank through a supply path, to the substrate W; a valve provided in the supply path; and a supply amount controller. Typically, the supply amount controller controls the amount of the resin R supplied to the substrate W by controlling the valve such that the resin R is applied to one shot area in one resin discharging operation.

The observation part 190 includes, for example, a camera and observes the overall shot areas of the substrate W. The observation part 190 can observe a contact state between the mold M and the resin R on the substrate W, a charge state of the resin R into the pattern in the mold M, a release state of the mold M from the cured resin R on the substrate W, etc.

The controller CNT includes a CPU, a memory, etc. and controls the entirety (respective parts) of the imprint apparatus 100. Furthermore, the controller CNT controls the imprint processing, the alignment processing, and other processing associated therewith. For example, the controller CNT corrects one or both of the positional deviation and the shape difference between the pattern on the mold and the shot area of the substrate, on the basis of the detection result obtained by the detection part 170. Note that the number of the controllers CNT is not limited to one, and more than one controller CNT may be used to control the respective parts.

The alignment unit 200 may include the detection part 170 and the controller CNT. The alignment unit 200 detects a mark pair, including a mold-side mark formed on the mold M and a substrate-side mark formed on the substrate W, and aligns the mold M and the substrate W according to the detection result.

Referring to FIGS. 2 and 3A to 3C, imprint processing performed by the exemplary imprint apparatus according to the first embodiment will be described.

Figure 2:
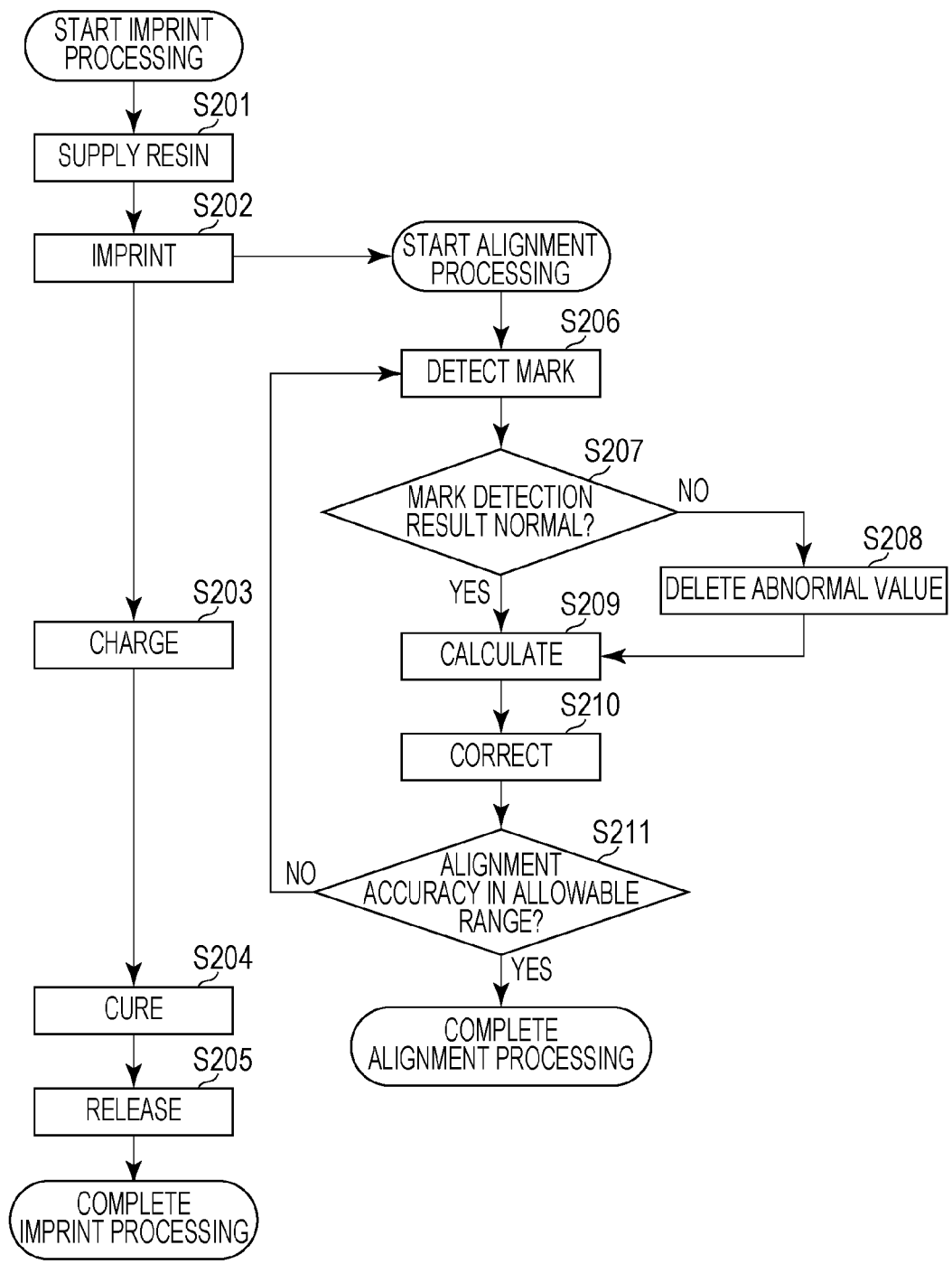
FIG. 2 shows an example flow of imprint processing and alignment processing according to the first embodiment.

FIG. 2 shows an example flow of the imprint processing and alignment processing according to the first embodiment. Steps S201 to S205 in FIG. 2 are one cycle of the imprint processing (i.e., imprint processing for one shot area). When multiple shot areas of the substrate W are imprinted, the imprint processing (steps S201 to S205) is repeated.

Figure 3A:
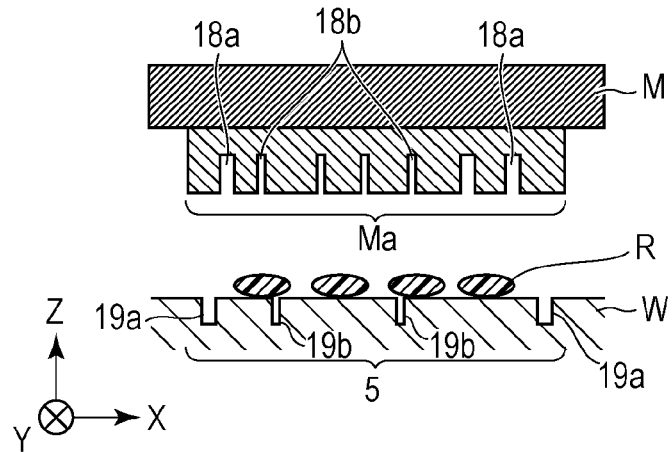
FIGS. 3A to 3C show examples of a mold, resin, and a substrate used in the imprint processing according to the first embodiment.
Figure 3B:
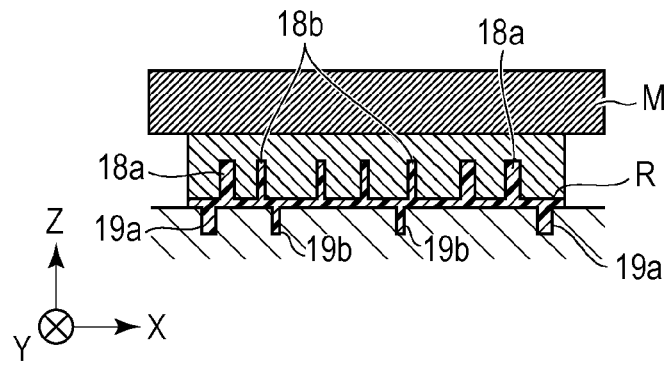
Figure 3C:
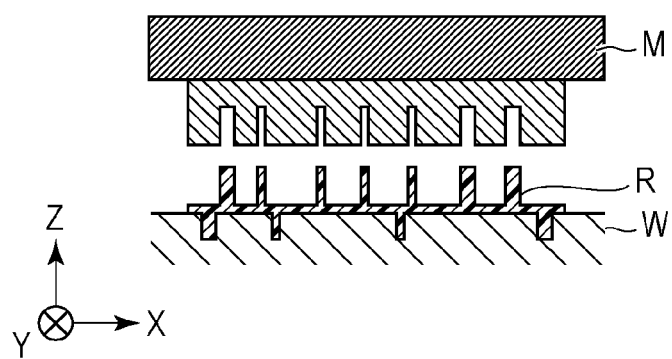

FIGS. 3A to 3C show, in section, examples of the mold M, the resin R, and the substrate W used in the imprint processing according to the first embodiment. FIGS. 3A to 3C show the imprint processing for transferring a pattern Ma (relief structure) formed on the mold M to the resin R on the substrate W.

In step S201, as shown in FIG. 3A, before starting imprinting, the resin R is supplied to a shot area 5 of the substrate W with the resin supply part 180. Because the resin is typically highly volatile, the resin R is supplied to the substrate W immediately before imprinting. When a low volatility resin is used, the resin R may be supplied to the entire surface (multiple shot areas) of the substrate in advance, by spin coating or the like. The memory of the controller CNT has arrangement information of droplets of the resin R preliminarily supplied to the substrate W. The supply of the resin by the resin supply part 180 is controlled according to the arrangement information. The arrangement information of droplets of the resin R is determined by taking into consideration the position of the pattern Ma formed on the mold M and the thickness of a residual layer.

For example, when the thickness of the residual layer is to be increased, the resin R is supplied according to such arrangement information that the interval between the droplets is reduced to increase the density of the droplets. Herein, the thickness of the residual layer is the thickness of the resin between the surface (bottom surface) of the concave portion of the relief pattern, which is formed of cured resin, and the surface of the substrate during imprinting.

In step S202, the mold M having the pattern Ma and the resin R on the substrate W are brought into contact with each other. After the resin R is supplied to the shot area 5 of the substrate W in step S201, the substrate stage 164 moves, moving the substrate W such that the shot area 5 and the pattern Ma face each other. After the substrate W is moved, the mold driving mechanism 134 is driven to bring the mold M and the substrate W toward each other until the pattern Ma and the resin R on the substrate W come into contact with each other.

In step S203, as shown in FIG. 3B, with the mold M in contact with the resin R, the resin R is charged into the pattern Ma. Furthermore, one or both of the positional deviation and the shape difference between the pattern Ma and the shot area need to be corrected before charging of the resin R is completed, and portions, in the pattern Ma, not filled with the resin R need to be eliminated before the resin R is cured. Therefore, a certain period of time (charging time) is ensured to sufficiently charge the resin R into the pattern Ma. By setting an appropriate charging time, portions, in the pattern Ma, not filled with the resin R can be reduced. Furthermore, because the charging time has an effect on the thickness of the residual layer of the resin R, it is necessary to set an appropriate charging time to achieve an appropriate residual layer thickness. After the mold M and the resin R on the substrate W are brought into contact with each other correction of one or both of the positional deviation and the shape difference, that is, the alignment processing (described below) is performed, similarly to the case before they are brought into contact with each other.

In step S204, to cure the resin R, the curing part 120 irradiates the resin R on the substrate W with light (for example, UV light) through the mold M. In general, the resin R starts to cure when the light coming from the curing part 120 reaches the resin R. Thus, the timing at which the resin R starts to cure equals the timing at which radiation of light is started. After the resin R on the substrate W starts to cure, the alignment processing is not performed because it could damage the pattern.

In step S205, the mold M is separated (released) from the cured resin R on the substrate W. More specifically, as shown in FIG. 3C, after the resin R on the substrate W is cured in step S204, the mold driving mechanism 134 is driven so as to move the mold M and the substrate W away from each other, separating the cured resin R on the substrate W and the mold M. The cured resin R on the substrate W and the mold M may be separated by driving both the mold driving mechanism 134 and the driving part 160 simultaneously or sequentially. In this way, a pattern corresponding to the pattern Ma is formed on the resin R on the substrate W. Furthermore, a mark corresponding to a mold-side mark 18, serving as an alignment mark, formed on the mold M is also formed on the resin R on the substrate W.

Referring to FIGS. 2 to 9, alignment processing performed by the exemplary imprint apparatus 100 according to the first embodiment will be described.

Steps S206 to S211 in FIG. 2 show one cycle of the alignment processing (i.e., alignment processing for one shot area). When multiple shot areas of the substrate are imprinted, the alignment processing (step S206 to S211) is repeated. In the alignment processing, first, the alignment scopes 172 detect at least two mark pairs, each including a mold-side mark 18 and a substrate-side mark 19 corresponding to the mold-side mark 18. Next, the controller CNT calculates the amount of positional deviation between the marks of each mark pair. From the amounts of positional deviation, a correction value for correcting one or both of the positional deviation and the shape difference between the pattern Ma and the shot area 5 is calculated. Then, one or both of the positional deviation and the shape difference are corrected to make the alignment accuracy between the pattern Ma and the shot area 5 fall within the allowable range. The alignment processing may be started either after step S203 is started or before the pattern Ma and the resin R come into contact with each other when the alignment scopes 172 can detect the marks before the pattern Ma and the resin R come into contact with each other.

In step S206, the alignment scopes 172 detect light coming from the mark pairs. Then, the controller CNT measures the positions of the two marks of each mark pair from the obtained alignment signals (images of the mark pairs), calculates the amount of positional deviation (distance) between the two marks, and stores the result in the memory of the controller CNT. The number of the alignment marks to be detected varies according to the number of the alignment scopes 172.

As shown in FIG. 3B, because the light radiated from the detection part 170 is transmitted through the mold M and the resin R, the detection part 170 can detect the substrate-side mark 19. However, after the mold M and the resin R are brought into contact with each other and the resin is charged into the concave portion in the pattern, the mold-side mark 18 may not be detected. This is because the refractive index difference between the mold-side mark 18 and the mold M after the mold M and the resin R are brought into contact with each other is smaller than that before the mold M and the resin R are brought into contact with each other. To counter this problem, a substance having a refractive index and a transmittance different from those of the mold M may be applied to the mold-side mark 18, or the refractive index may be changed by ion irradiation. By doing so, it is possible to detect the mold-side mark 18 even when the mold M and the resin R on the substrate W are in contact with each other.

In step S207, the controller CNT reads out the amounts of positional deviation (positional deviation information), stored in step S206, from the memory and determines whether or not the result of the mark detection in step S206 is normal. The difference between the amounts of positional deviation read out from the memory of the controller CNT is calculated as a determination value, and, if the determination value is smaller than a predetermined determination threshold, the amounts of positional deviation are in the allowable range. In such a case, the result of the mark detection is determined to be normal, and the process proceeds to step S209. Besides the difference between the amounts of positional deviation, the ratio of the amounts of positional deviation and other determination values that can be used to determine whether or not the amounts of positional deviation are normal may be used as the determination value. If the determination value is larger than the determination threshold, the amounts of positional deviation are not in the allowable range, and in such a case, the result of the mark detection is determined to be abnormal, and the process proceeds to step S208. The determination threshold may be stored in the memory of the controller CNT, to enable the determination threshold to be changed by an operation from a console screen (not shown).

In step S208, when the result of the mark detection is determined to be abnormal in step S207, the amounts of positional deviation are deleted from the memory of the controller CNT to prevent these amounts of positional deviation from being used to calculate a correction value in the subsequent step S209. Alternatively, a weighting factor corresponding to the amount of positional deviation between the marks of each mark pair may be used, and the weighting factor corresponding to the amount of positional deviation may be set to 0 or to a sufficiently small value.

In step S209, the amounts of positional deviation stored in the memory of the controller CNT are read out, the positional deviation and the shape difference are obtained, and a correction value for correcting one or both of them is calculated. As the number of the mark pairs detected in step S206 increases, it becomes possible to calculate correction values for distortion, etc., in addition to correction values for magnification and rotation errors. When using the weighting factor corresponding to the amount of positional deviation between the marks of each mark pair, the correction value may be calculated according to the weighting factor set in step S208 to minimize the influence of the amount of positional deviation on the correction value.

In step S210, one or both of the positional deviation and the shape difference are corrected according to the correction value calculated in step S209, so that the positional deviation and the shape difference fall within the allowable range. The positional deviation is corrected by the driving part 160, and the shape difference is corrected by the shape correcting part 140.

In S211, whether or not the alignment accuracy between the pattern Ma and the shot area 5 has fallen within the allowable range is determined, and, if it has not, the process returns to step S206, and if it has, the alignment processing is completed. By repeating the processing including steps S206 to S211, the positional deviation and the shape difference are reduced.

Furthermore, various information, such as the amounts of positional deviation (positional deviation information) calculated in step S206, information about the result of the determination performed in step S207, the amounts of positional deviation deleted in step S208, and the weighting factors, may be displayed on the console screen (not shown) of the imprint apparatus 100. Alternatively, such information may be reported to another computer, such as a host computer (not shown). Such information is referred to in a back-end process, such as an inspection process, and is useful in the quality control.

Figure 4:
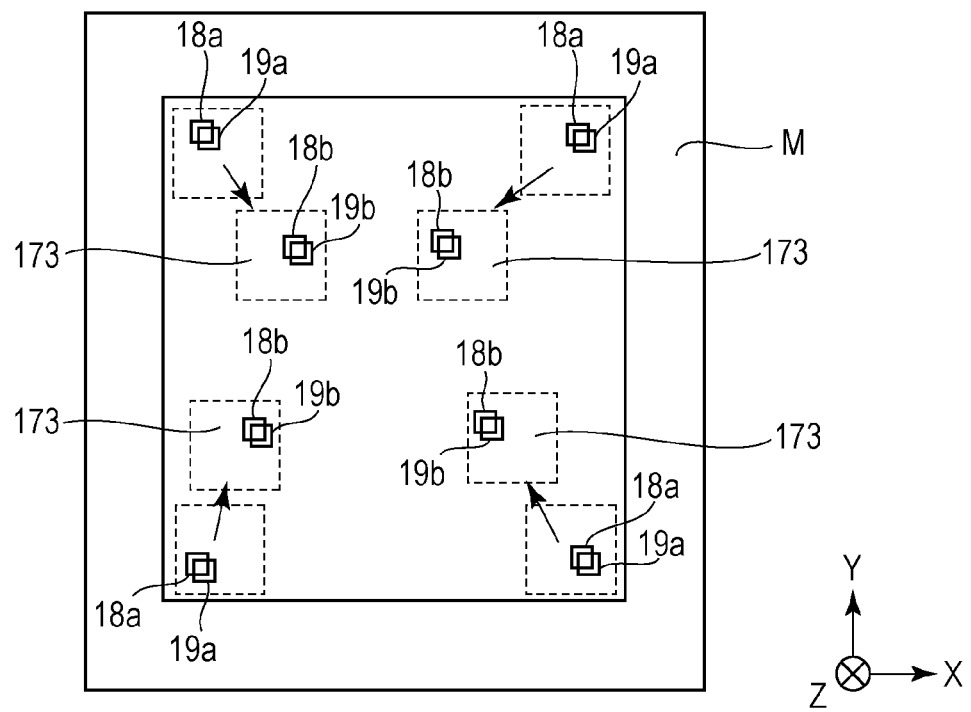
FIG. 4 shows an example alignment mark arrangement according to the first embodiment.

FIG. 4 shows an example alignment mark arrangement according to the first embodiment. Mold-side marks 18a are provided at four corners of the mold M. Substrate-side marks 19a are also provided at four corners of the shot area 5. By detecting the mark pairs, each including the mold-side mark 18a and the substrate-side mark 19a, the positions of the mark pairs may be measured.

Figure 5:
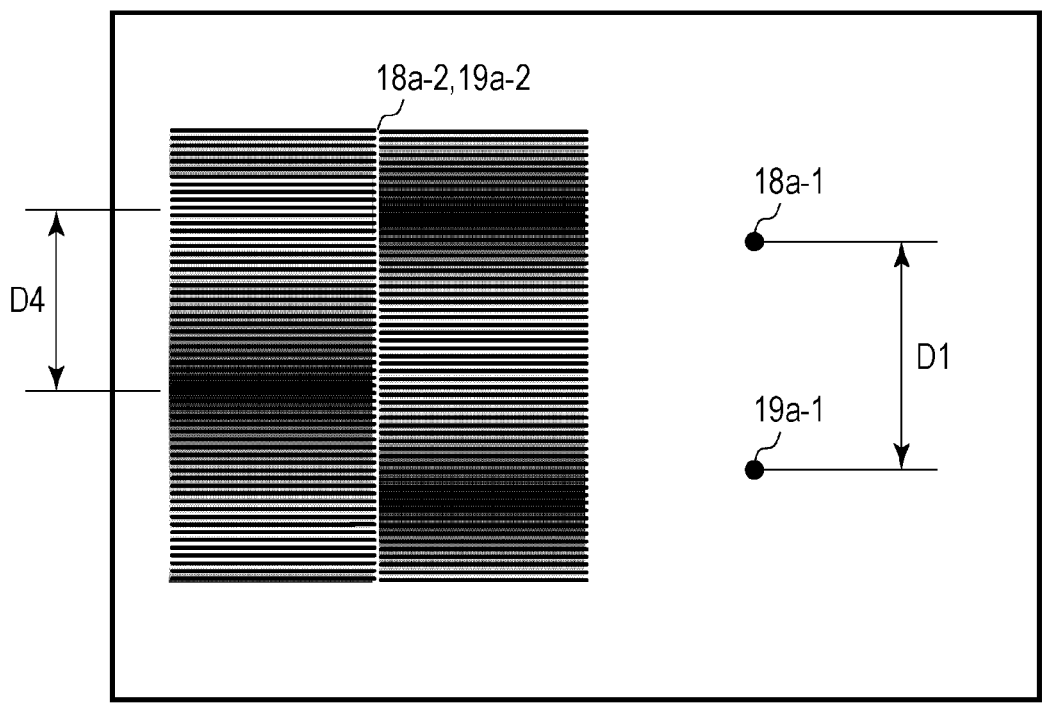
FIG. 5 shows a detailed example of an alignment mark according to the first embodiment.

FIG. 5 shows a detailed example of the alignment mark according to the first embodiment. To determine whether or not the result of the mark detection is normal in step S207, the alignment scopes 172 observe the at least two mark pairs. The alignment scopes 172 may observe the at least two mark pairs with a single field of view (single image pickup surface of an image pickup element). Alternatively, the at least two mark pairs may be sequentially observed with different fields of view, by driving the alignment stage mechanisms 174 or the stage driving mechanism (not shown). The alignment scopes 172 may observe the at least two mark pairs either simultaneously or sequentially.

The positions of the at least two mark pairs may be measured in the same direction. FIG. 5 shows an example in which the positions, in the Y direction (vertical direction), of the two mark pairs are measured. A mold-side mark 18a-1 and a substrate-side mark 19a-1, serving as a first mark pair, are rough detection marks. Herein, the rough detection marks are alignment marks for low-accuracy measurement in a large measuring range. Although the mold-side mark 18a-1 and the substrate-side mark 19a-1 are circular marks in the example in FIG. 5, the marks may have another specific shape, such as a cross shape, an L shape, a bar shape, a rectangular shape, a truncated chevron shape, and a mountain shape. The alignment scopes 172 detect the mold-side mark 18a-1 and the substrate-side mark 19a-1 (mark pair), which are circular marks. The controller CNT measures the positions of the centers of the marks, calculates the distance, D1, between the positions, and calculates the amount of positional deviation D3 (positional deviation information) of the mark pair, on the basis of the difference from a predetermined reference distance D2 between the center points of the circular marks. The amount of positional deviation D3 may be calculated by the following expression.

$$D3=D1-D2$$

A mold-side mark 18a-2 and a substrate-side mark 19a-2, serving as a second mark pair, are precise detection marks. The precise detection marks are alignment marks for high-accuracy measurement in a small measuring range. In the example in FIG. 5, although the precise detection mark on the mold and the precise detection mark on the substrate are grating-pattern marks to enable the amount of positional deviation to be detected by using a moire fringe, marks other than the grating-pattern marks may also be used.

The grating-pattern mark for alignment is provided on each of the mold and the substrate. The mold-side mark includes a grating pattern having a grating pitch in the measurement direction, and the substrate-side mark includes a checkerboard grating pattern having a grating pitch in each of the measurement direction and the direction perpendicular to the measurement direction (non-measurement direction). An illumination optical system for illuminating the marks and a detection optical system for detecting diffracted light from the marks are both provided so as to be inclined in the non-measurement direction from the direction perpendicular to the mold and the substrate. That is, the illumination optical system is configured to perform oblique illumination on the mark, in the non-measurement direction. The light obliquely incident on the mark is diffracted in the non-measurement direction by the checkerboard grating pattern provided on the substrate. The detection optical system is disposed so as to detect only diffracted light of a specific order other than zero order, in the non-measurement direction.

The grating-pattern mark (mold-side mark) provided on the mold and the grating-pattern mark (substrate-side mark) provided on the substrate have slightly different grating pitches in the measurement direction. When the grating patterns having different grating pitches are overlaid on one another, due to the interference of the diffracted light from the two grating patterns, an interference fringe (so-called moire fringe) having a cycle that reflects the difference in grating pitch between the grating patterns appears. At this time, because the phase of the moire fringe changes according to the positional relationship between the grating patterns, it is possible to measure the positional deviation between the substrate-side mark and the mold-side mark (mark pair) by observing the phase of the moire fringe. This method of measuring the positional deviation by using the moire fringe is advantageous in that it is possible to perform accurate alignment, even when a low-resolution detection optical system is used.

The positions of the peaks in a signal intensity distribution represented by the moire fringe, generated by overlying the mold-side mark 18a-2 and the substrate-side mark 19a-2 on one another, are measured. The distance, D4, between the peaks are calculated to calculate the amount of positional deviation, D5, between the mold-side mark 18a-2 and the substrate-side mark 19a-2 (mark pair). The pitch of the grating pattern of the mold-side mark 18a-2 is assumed to be P1, and the pitch of the grating pattern of the substrate-side mark 19a-2 is assumed to be P2. A moire signal is generated by overlying the mold-side mark 18a-2 and the substrate-side mark 19a-2 on one another. At this time, the length, D6, of one period of the moire signal can be obtained by the following Expression.

$$D6=(P1 \times P2)/(P1-P2)/2$$

Furthermore, the moire magnification K can be obtained by the following Expression.

$$K=P1/(P1-P2)/2$$

Hence, the amount of positional deviation (positional deviation information), D5, between the mold-side mark 18a-2 and the substrate-side mark 19a-2 (mark pair) can be obtained from the distance, D4, between the peaks in the signal intensity distribution represented by the moire fringe and the moire magnification K, by the following Expression.

$$D5=D4 \times K=D4 \times P1/(P1-P2)/2$$

When the marks are detected properly, the absolute value of the difference between the distance (amount of positional deviation) D3 between the marks constituting the first mark pair and the distance (amount of positional deviation) D5 between the marks constituting the second mark pair, obtained from the two mark pairs, is a sufficiently small value. In contrast, even when the marks are detected, if the positional deviation between the mold-side mark 18 and the substrate-side mark 19 (mark pair) cannot be properly measured, the absolute value (|D3-D5|) is a large value. Such a situation may be caused by a foreign particle trapped between the mold-side mark and the substrate-side mark, failure to charge the resin between the mold-side mark and the substrate-side mark, damage to one or both of the mold-side mark and the substrate-side mark, etc.

The determination in step S207 is performed by comparing the determination threshold S stored in the controller CNT with the absolute value. When the determination threshold S is larger than the absolute value (S>|D3-D5|), it is determined that the mark detection is normal, and when the determination threshold S is smaller than or equal to the absolute value (S≤|D3-D5|), it is determined that the mark detection is abnormal. When the determination threshold S equals the absolute value, the mark detection may be determined to be normal.

Although FIG. 5 shows an example in which the precise detection mark pair and the rough detection mark pair are combined, a combination of a precise detection mark pair and a precise detection mark pair, a combination of a rough detection mark pair and a rough detection mark pair, and a combination of any of three or more precise and rough detection mark pairs are also possible. Furthermore, although FIG. 5 shows mark pairs for measuring the positional deviation in the Y direction (vertical direction), mark pairs for measuring the positional deviation in the X direction (horizontal direction) may also be combined.

Figure 6:
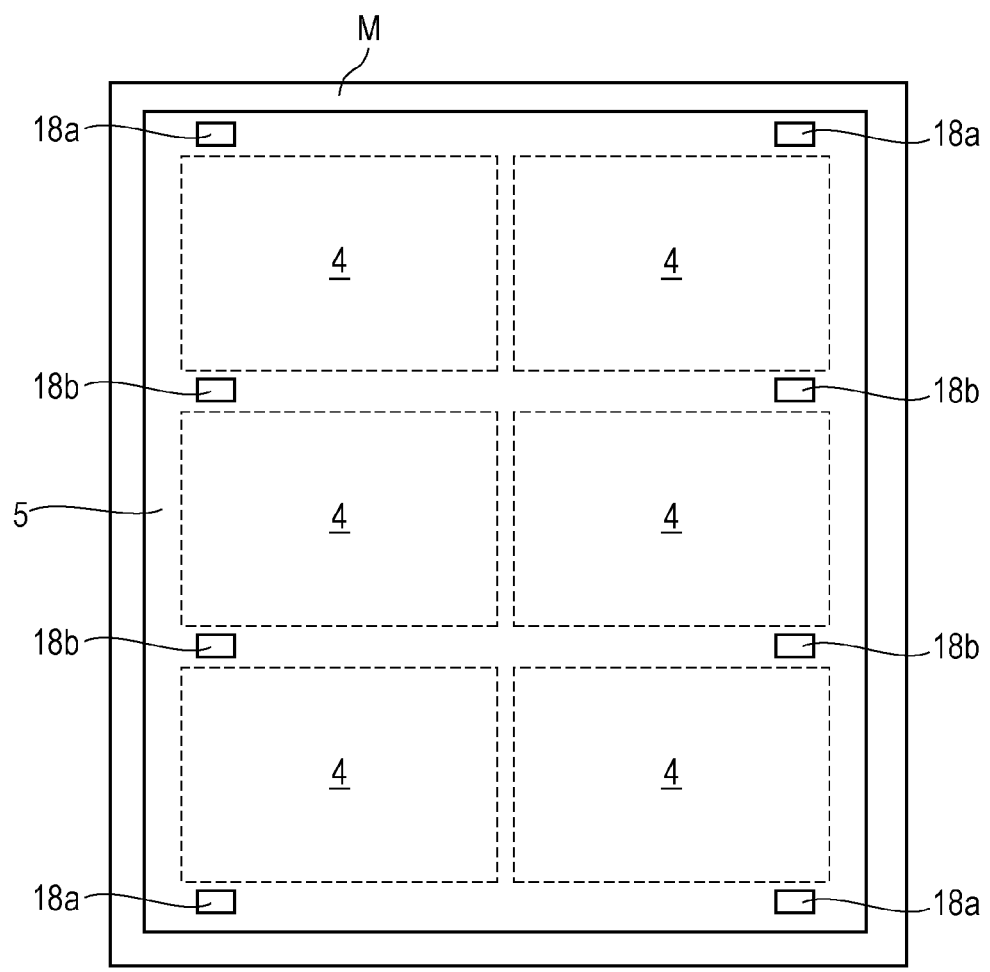
FIG. 6 shows an example arrangement of a shot area and chip areas according to the first embodiment.

FIG. 6 shows an example arrangement of a shot area and chip areas according to the first embodiment. Although FIG. 6 shows an example in which the mold-side marks 18a are provided at four corners of the shot area 5 and other mold-side marks 18b are provided in scribe lines between the chip areas, the mold-side marks 18b may be provided at any desired positions. Furthermore, although the mold M and the substrate W having the shot area 5 with six chip areas 4 are used, the number of chip areas 4 is not limited to six.

Although the first embodiment has been described above, the present invention is not limited thereto, and it may be variously modified within the scope of the invention.

Accordingly, with the imprint apparatus according to the first embodiment, it is possible to reduce decrease in alignment accuracy by lowering the influence, on the calculation of the correction value, of the amount of positional deviation calculated from the mark pair the detection result of which has been determined to be abnormal.

Second Embodiment

Figure 7:
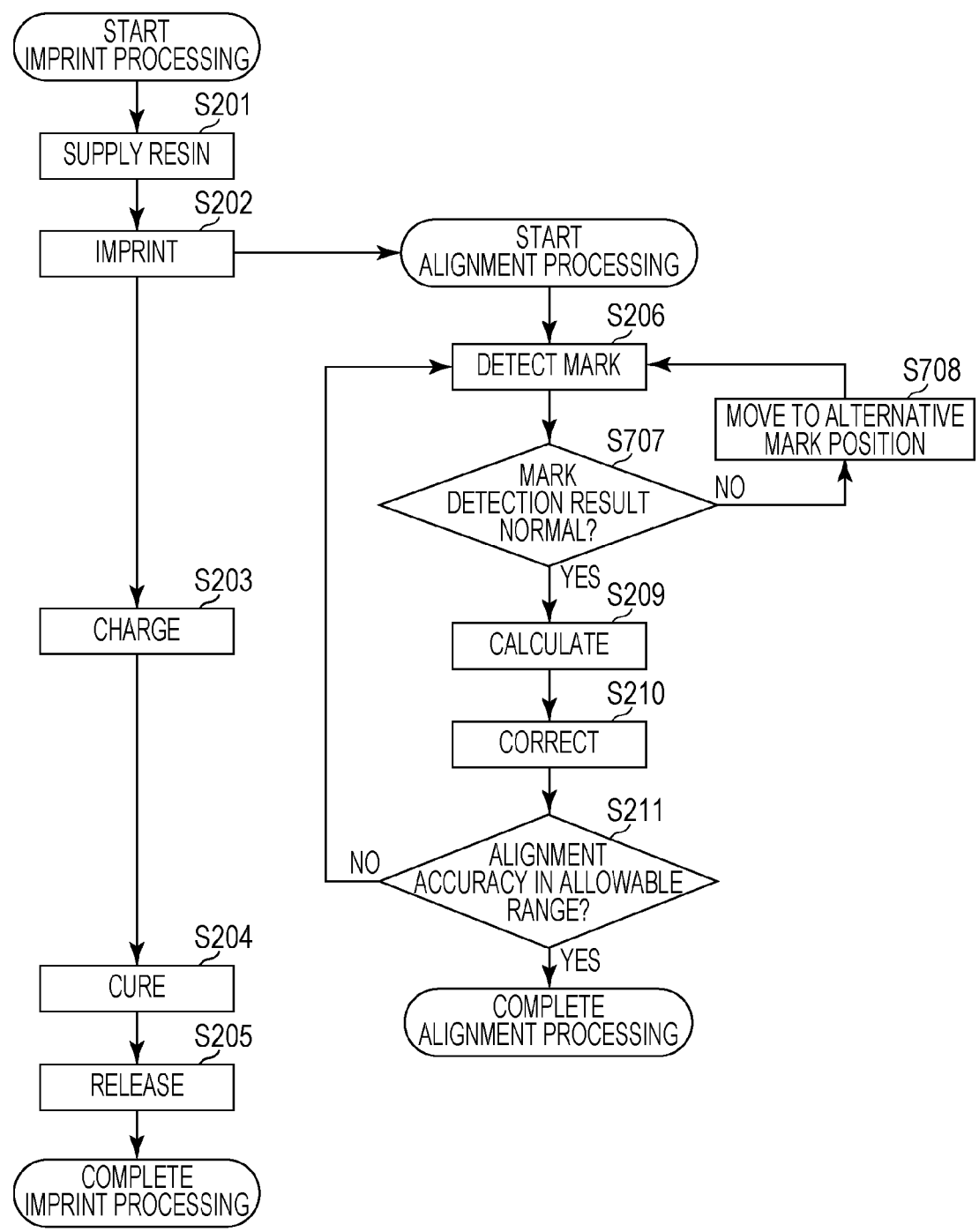
FIG. 7 shows an example flow of alignment processing according to a second embodiment.

Referring to FIGS. 4 and 7, an imprint apparatus according to a second embodiment will be described. The features not to be mentioned in this section may be the same as those in the first embodiment.

FIG. 7 shows an example flow of the imprint processing and alignment processing according to the second embodiment. The imprint processing in FIG. 7 is the same as that in FIG. 2. The alignment processing in FIG. 7 differs from that in FIG. 2 in steps S707 and S708.

When the mark detection in step S206 is determined to be abnormal in step S707, the process proceeds to step S708. The determination performed in step S707 is the same as that in step S207 in the first embodiment. In step S708, the alignment scopes 172 are driven to move the fields of view 173 of the alignment scopes 172 to the positions where alternative marks are arranged. Then, the process returns to step S206, where the alternative marks are detected.

FIG. 4 shows mold-side marks 18b and substrate-side marks 19b, serving as alternative marks. By driving the alignment stage mechanisms 174, the alignment scopes 172 are moved in the X-Y directions, moving the fields of view 173 of the alignment scopes 172 to other positions on the mold M. The alignment scopes 172 move to positions where the mold-side marks 18b and the substrate-side marks 19b are included in the fields of view 173 and detect the mold-side marks 18b and the substrate-side marks 19b, serving as the alternative marks, which are different from the mold-side marks 18a and the substrate-side marks 19a detected in step S206.

In step S206, the mold-side marks 18b and the substrate-side marks 19b are detected, the positions thereof are measured, and the amounts of positional deviation are calculated and stored in the memory of the controller CNT.

In step S707, the amounts of positional deviation of the mold-side marks 18b and the substrate-side marks 19b are read out from the memory of the controller CNT to determine whether or not the result of the mark detection in step S206 is normal. When the result of the mark detection is determined to be normal, the process proceeds to step S209. When the result of the mark detection is determined to be abnormal, the process proceeds to step S708, and the alignment scopes 172 are driven again to detect other alternative marks (not shown). If there are no other alternative marks (not shown), the abnormal detection value may be deleted from the memory of the controller CNT, as in step S208 in FIG. 2. Alternatively, the influence of the amount of positional deviation on the correction value may be minimized by setting the weighting factor corresponding to the amount of positional deviation between a pair of marks the detection result of which has been determined to be abnormal to 0 or to a sufficiently small value.

As shown in FIG. 6, the mold-side marks 18b, serving as the alternative marks, may be provided in the scribe lines between the chip areas 4.

Although the second embodiment has been described above, the present invention is not limited thereto, and it may be variously modified within the scope of the invention.

Accordingly, with the imprint apparatus according to the second embodiment, it is possible to reduce decrease in alignment accuracy by lowering the influence, on the calculation of the correction value, of the amount of positional deviation calculated from the mark pair the detection result of which has been determined to be abnormal. Furthermore, if there is a mark pair the detection result of which has been determined to be abnormal, alternative marks may be detected. By doing so, it is possible to perform collection on the basis of the correction value calculated from the detection result that has been determined to be normal, making it possible to improve the alignment accuracy.

Third Embodiment

Figure 8:
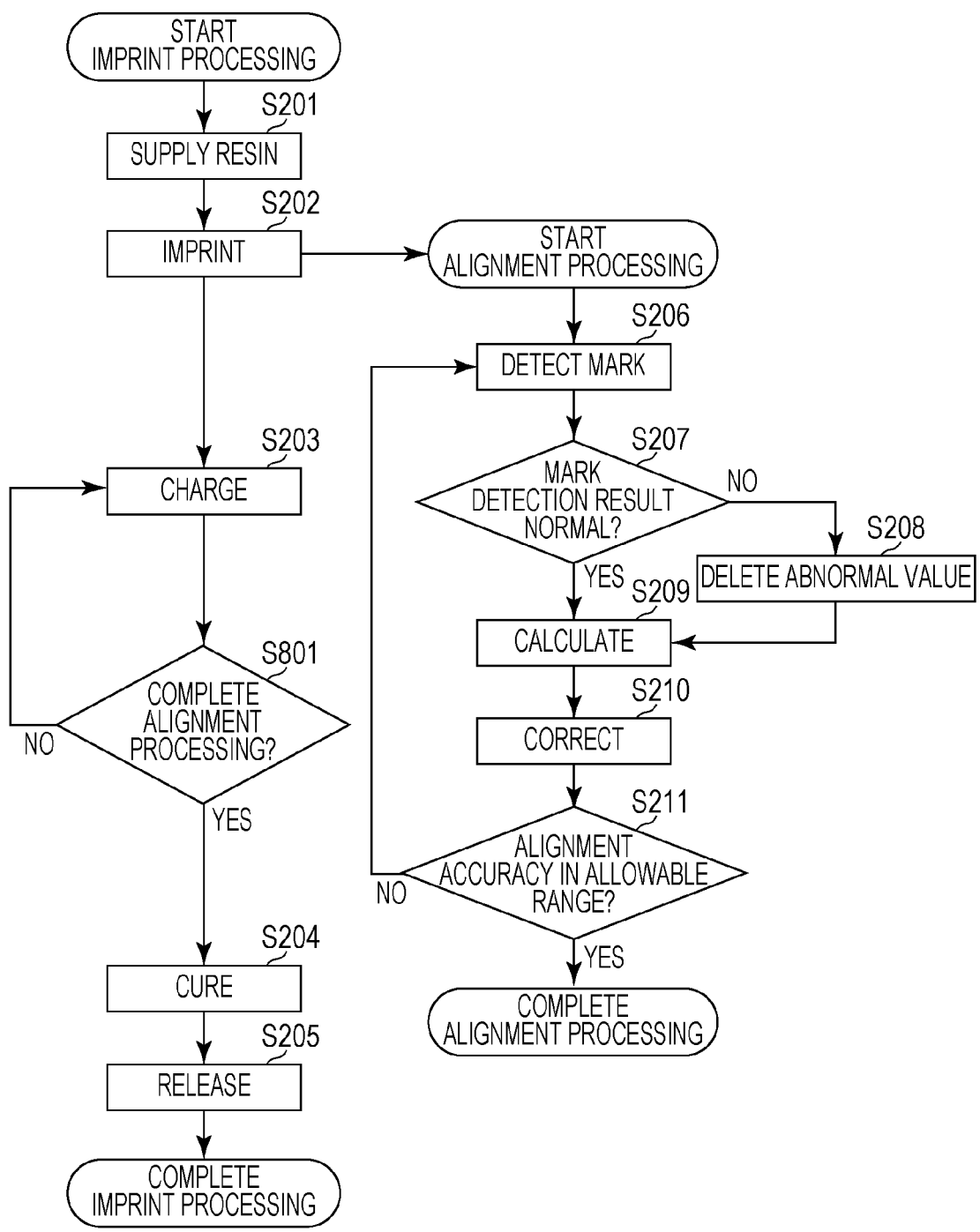
FIG. 8 shows an example flow of imprint processing according to a third embodiment.

Referring to FIG. 8, an imprint apparatus according to a third embodiment will be described. The features not to be mentioned in this section may be the same as those in the first and second embodiments.

FIG. 8 shows an example flow of imprint processing according to a third embodiment.

As has been described above, the alignment processing needs to be completed before curing (step S204) is started in the imprint processing. However, when the alignment processing time is extended because, for example, the alignment accuracy does not fall within the allowable range and the alignment processing is repeated, the alignment processing may not be completed before the commencement of step S204.

Hence, in the example in FIG. 8, whether or not the alignment processing has been completed is determined in step S801. When the alignment processing has been completed, the process proceeds to step S204, and when the alignment processing has not yet been completed, the process returns to step S203, and the charging time is extended until the alignment processing is completed. The upper limit of the charging time to be extended may be either a period of time determined in advance by taking into consideration the influence on the thickness of the residual layer, or a time obtained from the processing conditions, such as the characteristics of the resin, the pattern on the mold, etc. In such a case, whether or not the charging time has exceeded the upper limit is also determined in step S801, and if the charging time has exceeded the upper limit, the alignment processing is terminated, and the process proceeds to step S204. Alternatively, it is also possible to store a plurality of periods of extension time in the memory of the controller CNT, so that the charging time is increased in a stepwise manner.

Although the third embodiment has been described above, the present invention is not limited thereto, and it may be variously modified within the scope of the invention.

Accordingly, with the imprint apparatus according to the third embodiment, it is possible to reduce decrease in alignment accuracy by lowering the influence, on the calculation of the correction value, of the amount of positional deviation calculated from the mark pair the detection result of which has been determined to be abnormal. Furthermore, by extending the charging time until the alignment processing is completed, the alignment accuracy can be improved.

Fourth Embodiment

Figure 9:
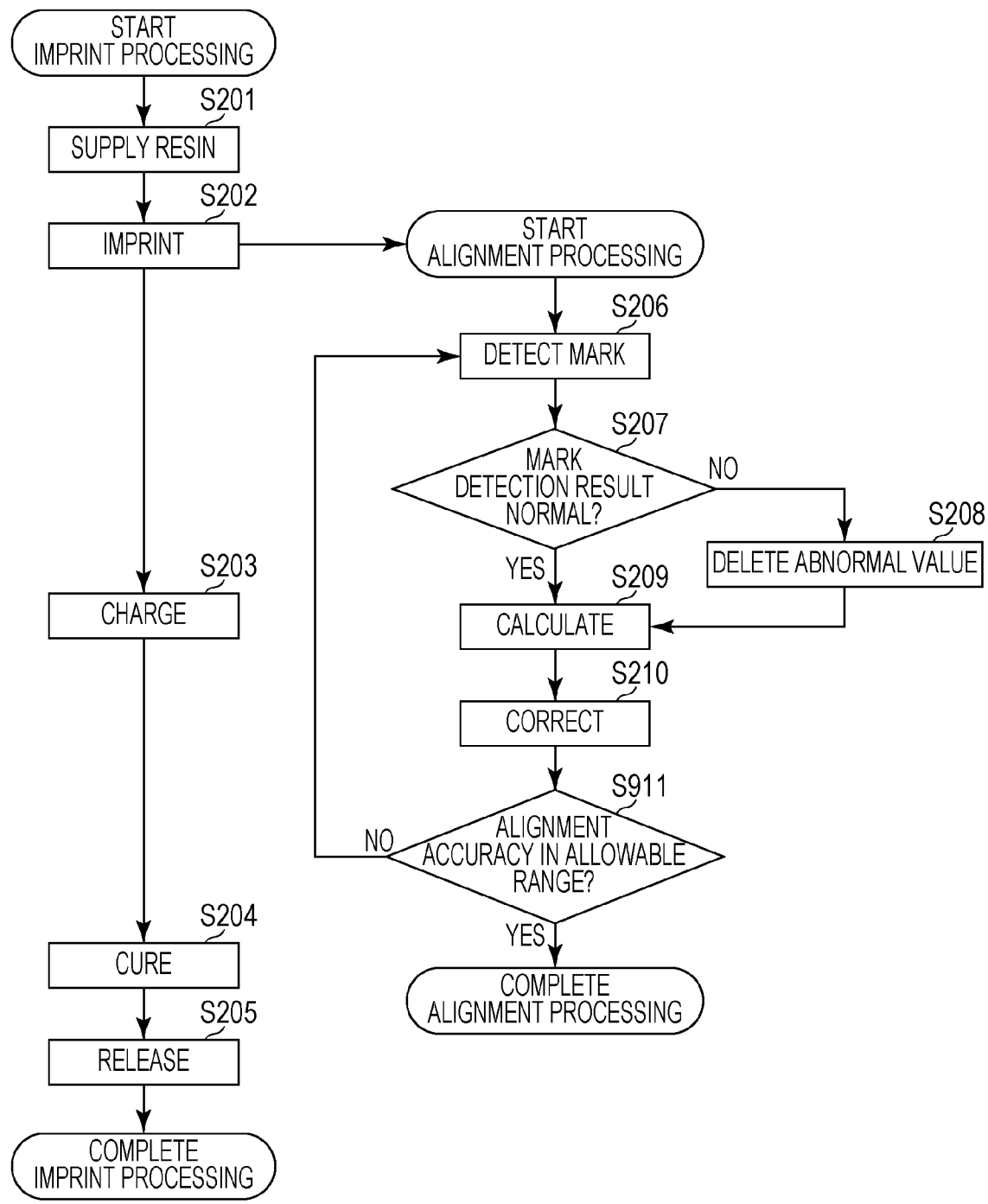
FIG. 9 shows an example flow of alignment processing according to a fourth embodiment.

Referring to FIG. 9, an imprint apparatus according to a fourth embodiment will be described. The features not to be mentioned in this section may be the same as those in the first, second and third embodiments.

FIG. 9 shows an example flow of alignment processing according to a fourth embodiment.

In step S203, as described above, the mold M is brought into contact with the resin R, and the resin R is charged into the pattern (relief structure) formed on the mold M. As described above, because the charging time has an effect on the thickness of the residual layer of the resin R, it is necessary to appropriately set the charging time. However, if the charging time is extended, as in the third embodiment, the charging time may exceed the appropriate time, failing to form a residual layer with an appropriate thickness.

Hence, in step S911 in FIG. 9, whether or not the alignment accuracy has fallen within the allowable range is determined, and whether or not the time elapsed from the commencement of the alignment processing has exceeded an appropriate charging time is determined. When the alignment accuracy has not yet fallen within the allowable range and when the time elapsed from the commencement of the alignment processing has not yet exceeded the appropriate charging time, the process returns to step S206, and in the other cases, the alignment processing is completed. To determine whether or not the time elapsed from the commencement of the alignment processing has exceeded the appropriate charging time, the appropriate charging time is stored in the memory of the controller CNT in advance. Herein, the appropriate charging time may be either a period of time determined in advance by taking the influence on the thickness of the residual layer, or a time obtained from the processing conditions, such as the characteristics of the resin, the pattern on the mold, etc.

Although the fourth embodiment has been described above, the present invention is not limited thereto, and it may be variously modified within the scope of the invention.

Accordingly, with the imprint apparatus according to the fourth embodiment, it is possible to reduce decrease in alignment accuracy by lowering the influence, on the calculation of the correction value, of the amount of positional deviation calculated from the mark pair the detection result of which has been determined to be abnormal. Furthermore, by making the alignment processing time less than or equal to the threshold, it is possible to reduce decrease in alignment accuracy, to set an appropriate charging time, and to form a residual layer having an appropriate thickness.

Fifth Embodiment

Figure 10:
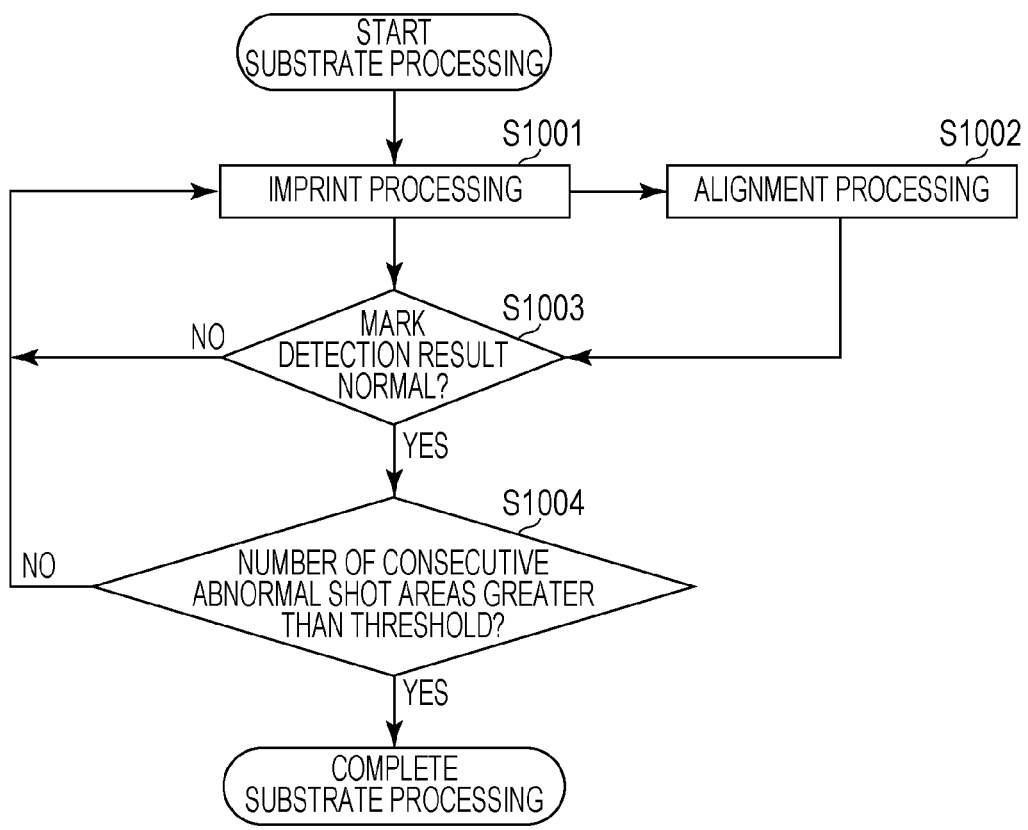
FIG. 10 shows an example flow of imprint processing according to a fifth embodiment.

Referring to FIG. 10, an imprint apparatus according to a fifth embodiment will be described. The features not to be mentioned in this section may be the same as those in the first, second, third, and fourth embodiments.

FIG. 10 shows an example flow of substrate processing according to the fifth embodiment.

In the alignment processing, if there are two or more consecutive shot areas in which the mark detection result has been determined to be abnormal (i.e., the determination value calculated by using the amount of positional deviation between a pair of marks is not within the allowable range), the result of mark detection in the subsequent shot area will probably be determined to be abnormal, decreasing the alignment accuracy. Hence, when there are two or more consecutive shot areas in which the mark detection result has been determined to be abnormal, the imprint processing is not performed on the subsequent shot area, and the substrate processing is terminated.

Step S1001 is the imprint processing including at least steps S202 to S205, and step S1002 is the alignment processing including at least steps S206 to S211.

In step S1003, whether or not there is a mark pair the detection result of which has been determined to be abnormal in the alignment processing is determined. If it is determined that there is a mark pair the detection result of which has been determined to be abnormal, the number of consecutive abnormal shot areas, stored in the memory of the controller CNT, is increased by one. If it is not determined that there is a mark pair the detection result of which has been determined to be abnormal, the number of consecutive abnormal shot areas, stored in the memory of the controller CNT, is set to 0. The number of consecutive abnormal shot areas is reset to 0 when the substrate processing is started.

In step S1004, whether or not the number of consecutive abnormal shot areas, stored in the memory of the controller CNT, has reached or exceeded a predetermined threshold is determined. When it is determined that the number of consecutive abnormal shot areas has reached or exceeded a predetermined threshold, the substrate processing is completed. When it is determined that the number of consecutive abnormal shot areas is less than the threshold, the process returns to step S1001. In step S1004, whether or not the imprint processing is performed on the final shot area of the substrate is also determined, and, when it is determined that the imprint processing is performed on the final shot area of the substrate, the substrate processing is completed.

Although the fifth embodiment has been described above, the present invention is not limited thereto, and it may be variously modified within the scope of the invention.

Accordingly, with the imprint apparatus according to the fifth embodiment, by lowering the influence, on the calculation of the correction value, of the amount of positional deviation calculated from the mark pair the detection result of which has been determined to be abnormal, it is possible to reduce decrease in alignment accuracy. Furthermore, by terminating the substrate processing when there are two or more consecutive shot areas in which the mark detection result has been determined to be abnormal, it is possible to prevent the pattern from being kept imprinted on the substrate with decreased alignment accuracy.

Article Manufacturing Method

An article manufacturing method will be described below. Examples of the article include devices (semiconductor devices, magnetic storage media, liquid crystal display elements, etc.), color filters, and hard disks. This manufacturing method includes a process of forming a pattern on a substrate (e.g., a wafer, a glass plate, and a film substrate), using the imprint apparatus 100. This manufacturing method further includes a process of processing the substrate on which the pattern is formed. This process may include a step of removing a residual layer of the pattern and other known steps, such as a step of etching the substrate by using the pattern as a mask. The article manufacturing method according to this embodiment is advantageous over the existing methods in, at least, one of the performance, quality, production efficiency, and manufacturing cost.

The imprint apparatus according to the first to fifth embodiments may be embodied not only individually but also in combination.

The present invention provides an imprint apparatus that can reduce decrease in alignment accuracy.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-079472, filed Apr. 8, 2015, which is hereby incorporated by reference herein in its entirety.

What is claimed is:

1. An imprint apparatus configured to bring an imprinting material on a substrate and a mold into contact with each other to form a pattern on the imprinting material, the apparatus comprising:

a driving unit configured to drive a substrate holder for holding the substrate;

a shape correcting part configured to correct a shape of the mold by applying pressure to the mold from an outer circumference thereof; and a controller configured to control alignment of the mold and the substrate on the basis of a result of a mark detection detecting light, from a first mold-side mark and a second mold-side mark that are formed on the mold and a first substrate-side mark and a second substrate-side mark that are formed on the substrate, with a single field of view using an image pickup element, wherein the controller is configured to compare, with a threshold, a difference between a first amount of positional deviation, in a predetermined direction, between the first mold-side mark and the first substrate-side mark and a second amount of positional deviation, in the predetermined direction, between the second mold-side mark and the second substrate-side mark or a ratio of the first amount of positional deviation to the second amount of positional deviation, and configured to determine whether the mark detection is abnormal by a magnitude relation between the difference or the ratio and the threshold, and wherein the controller is further configured to correct, by controlling the driving part and the shape correcting part, one or both of a positional deviation and a shape difference between the pattern on the mold and a shot area of the substrate, wherein, the controller is programmed to determine that the mark detection is abnormal, and when the mark detection is determined to be abnormal, the controller is programmed not to use the first amount of positional deviation and the second amount of positional deviation for a calculation of a correction value to correct one or both of a positional deviation and a shape difference between the pattern on the mold and a shot area of the substrate, or to minimize respective influences of the first amount of positional deviation and the second amount of positional deviation on the calculation of the correction value.

2. The imprint apparatus according to claim 1, further comprising:

a detector configured to perform the mark detection,
wherein the detector is configured to detect the light from the first mold-side mark, the first substrate-side mark, the second mold-side mark, and the second substrate-side mark with the imprinting material being in contact with the pattern on the mold.

3. The imprint apparatus according to claim 1, wherein the controller is programmed to perform the correction for each shot area from a plurality of shot areas of the substrate, one or both of a positional deviation and the shape difference between the pattern on the mold and the shot area of the substrate.

4. The imprint apparatus according to claim 1, wherein a shape of the first mold-side mark and a shape of the second mold-side mark are different from each other, and a shape of the first substrate-side mark and a shape of the second substrate-side mark are different from each other.

5. The imprint apparatus according to claim 1, wherein the first mold-side mark and the first substrate-side mark are rough detection marks, and the second mold-side mark and the second substrate-side mark are precise detection marks for more accurate measurement than measurement using the rough detection marks.

6. The imprint apparatus according to claim 5, wherein the precise detection marks are grating-pattern marks that generate a moire fringe, and the second amount of positional deviation is detected with the moire fringe.

7. The imprint apparatus according to claim 5, wherein the detector is configured to detect the first mold-side mark, the first substrate-side mark, the second mold-side mark, and the second substrate-side mark simultaneously with a single image pickup surface of the image pickup element.

8. The imprint apparatus according to claim 1, wherein a determination threshold used to determine whether the mark detection is abnormal or not is changeable.

9. The imprint apparatus according to claim 1, wherein, in a case where there are two or more consecutive shot areas in each of which the mark detection has been determined to be abnormal, the controller is programmed to terminate substrate processing.

10. The imprint apparatus according to claim 1, wherein the second mold-side mark and the second substrate-side mark are grating-pattern marks that generate a moire fringe, and the controller is configured to control the alignment of the mold and the substrate on the basis of a result of a mark detection detecting the moire fringe.

11. The imprint apparatus according to claim 1, wherein the light includes a first light from the first mold-side mark, a second light from the second mold-side mark, a third light from the first substrate-side mark and a fourth light from the second substrate-side mark.

12. An imprint apparatus configured to bring an imprinting material on a substrate and a mold into contact with each other to form a pattern on the imprinting material, the apparatus comprising:
a driving unit configured to drive a substrate holder for holding the substrate;
a shape correcting part configured to correct a shape of the mold by applying pressure to the mold from an outer circumference thereof;
a detector configured to perform a mark detection by detecting light from a first mold-side mark and a second mold-side mark that are formed on the mold and a first substrate-side mark and a second substrate-side mark that are formed on the substrate, with a single field of view using an image pickup element with the imprinting material being in contact with the pattern on the mold,
a controller configured to control alignment of the mold and the substrate on the basis of a result of the mark detection; and
wherein the controller is configured to compare, with a threshold, a difference between a first amount of positional deviation, in a predetermined direction, between the first mold-side mark and the first substrate-side mark and a second amount of positional deviation, in the predetermined direction, between the second mold-side mark and the second substrate-side mark or a ratio of the first amount of positional deviation to the second amount of positional deviation, and determine whether the mark detection is abnormal by a magnitude relation between the difference or the ratio and the threshold, and
wherein the controller is programmed to correct, by controlling the driving part and the shape correcting part, one or both of a positional deviation and a shape difference between the pattern on the mold and a shot area of the substrate,
wherein, when the controller is further configured to direct the detector to detect another mold-side mark that is different from the first mold-side mark and the second mold-side mark and another substrate-side mark that is different from the first substrate-side mark and the second substrate-side mark, when it has been determined by the controller that the mark detection is abnormal.

13. An alignment apparatus configured to align a first object and a second object, the apparatus comprising a controller configured to control alignment of the first object and the second object on the basis of a result of a mark detection detecting light from a first mark and a second mark that are formed on the first object, a third mark and a fourth mark that are formed on the second object with a single field of view using an image pickup element,
wherein the controller is configured to compare, with a threshold, a difference between a first amount of positional deviation, in a predetermined direction, between the first mark and the third mark and a second amount of positional deviation, in the predetermined direction, between the second mark and the fourth mark or a ratio of the first amount of positional deviation to the second amount of positional deviation, and determines whether the mark detection is abnormal by a magnitude relation between the difference or the ratio and the threshold, and
wherein the second mark and the fourth mark are grating-pattern marks that generate a moire fringe, and the controller is configured to control the alignment of the first object and the second object on the basis of a result of a mark detection detecting the moire fringe,
wherein, is configured not to use the first amount of positional deviation and the second amount of positional deviation for a calculation of a correction value to correct one or both of a positional deviation and a shape difference between the pattern on the mold and a shot area of the substrate, or to minimize respective influences of the first amount of positional deviation and the second amount of positional deviation on the calculation of the correction value.

14. The alignment apparatus according to claim 13, wherein a shape of the first mark and a shape of the second mark are different from each other, and a shape of the third mark and a shape of the fourth mark are different from each other.

15. The alignment apparatus according to claim 13, wherein the first mark and the third mark are rough detection marks, and the second mark and the fourth mark are precise detection marks for more accurate measurement than measurement using the rough detection marks.

16. The alignment apparatus according to claim 13, wherein the precise detection marks are grating-pattern marks that generate a moire fringe, and the second amount of positional deviation is detected with the moire fringe.

17. The alignment apparatus according to claim 13, wherein the image pickup element is configured to observe the first mark, the second mark, the third mark, and the fourth mark with a single field of view.

18. The alignment apparatus according to claim 13, wherein the light includes a first light from the first mark, a second light from the second mark, a third light from the third mark and a fourth light from the fourth mark.

19. An imprint apparatus configured to bring an imprinting material on a substrate and a mold into contact with each other to form a pattern on the imprinting material, the apparatus comprising:
a driving unit configured to drive a substrate holder for holding the substrate;
a shape correcting part configured to correct a shape of the mold by applying pressure to the mold from an outer circumference thereof; and
a controller configured to control alignment of the mold and the substrate on the basis of a result of a mark detection detecting light, from a first mold-side mark and a second mold-side mark that are formed on the mold and a first substrate-side mark and a second substrate-side mark that are formed on the substrate, with a single field of view using an image pickup element,
wherein the controller is configured to compare, with a threshold, a difference between a first amount of positional deviation, in a predetermined direction, between the first mold-side mark and the first substrate-side mark and a second amount of positional deviation, in the predetermined direction, between the second mold-side mark and the second substrate-side mark or a ratio of the first amount of positional deviation to the second amount of positional deviation, and configured to determine whether the mark detection is abnormal by a magnitude relation between the difference or the ratio and the threshold, and
wherein the controller is further configured to correct, by controlling the driving part and the shape correcting part, one or both of a positional deviation and a shape difference between the pattern on the mold and a shot area of the substrate,
wherein, in a case where there are two or more consecutive shot areas in each of which the mark detection has been determined to be abnormal, the controller is programmed to terminate substrate processing.

20. An article manufacturing method comprising: a process of forming a pattern on a substrate by using the imprint apparatus; and a process of processing the substrate on which the pattern is formed in the process of forming the pattern, wherein an imprint apparatus bring an imprinting material on a substrate and a mold into contact with each other to form a pattern on the imprinting material, and includes: a driving unit configured to drive a substrate holder for holding the substrate; a shape correcting part configured to correct a shape of the mold by applying pressure to the mold from an outer circumference thereof; and a controller configured to control an alignment of the mold and the substrate on the basis of a result of a mark detection detecting light from a first mold-side mark and a second mold-side mark that are formed on the mold a first substrate-side mark and a second substrate-side mark that are formed on the substrate with a single field of view using an image pickup element, wherein the controller compares, with a threshold, a difference between a first amount of positional deviation, in a predetermined direction, between the first mold-side mark and the first substrate-side mark and a second amount of positional deviation, in the predetermined direction, between the second mold-side mark and the second substrate-side mark or a ratio of the first amount of positional deviation to the second amount of positional deviation, and determines whether the mark detection is abnormal by a magnitude relation between the difference or the ratio and the threshold, and wherein the controller corrects, by controlling the driving part and the shape correcting part, one or both of a positional deviation and a shape difference between the pattern on the mold and a shot area of the substrate, wherein, when the controller determines that the mark detection is abnormal, the controller does not use the first amount of positional deviation and the second amount of positional deviation for a calculation of a correction value to correct one or both of a positional deviation and a shape difference between the pattern on the mold and a shot area of the substrate, or minimizes respective influences of the first amount of positional deviation and the second amount of positional deviation on the calculation of the correction value.

21. An alignment method for aligning a first object and a second object on the basis of a result of a mark detection detecting light from a first mark and a second mark that are formed on the first object, a third mark and a fourth mark that are formed on the second object with a single field of view using an image pickup element, the method comprising: a detection process of detecting a first amount of positional deviation between the first mark and the third mark in a predetermined direction and a second amount of positional deviation between the second mark and the fourth mark in the predetermined direction; a comparing process of comparing, with a threshold, a difference between first amount of positional deviation, in a predetermined direction, between the first mark and the third mark and a second amount of positional deviation, in the predetermined direction, between the second mark and the fourth mark or a ratio of the first amount of positional deviation to the second amount of positional deviation; a determination process of determining whether the mark detection is abnormal by a magnitude relation between the difference or the ratio and the threshold; and a correcting process of correcting one or both of a positional deviation and a shape difference between the pattern on the mold and a shot area of the substrate.

22. The alignment method according to claim 21, wherein a shape of the first mark and a shape of the second mark are different from each other, and a shape of the third mark and a shape of the fourth mark are different from each other.

23. The alignment method according to claim 21, wherein the first mark and the third mark are rough detection marks, and the second mark and the fourth mark are precise detection marks for more accurate measurement than measurement using the rough detection marks.

24. The alignment method according to claim 23, wherein the precise detection marks are grating-pattern marks that generate a moire fringe, and the second amount of positional deviation is detected with the moire fringe.

25. The alignment method according to claim 21, wherein the first mark, the second mark, the third mark, and the fourth mark are observed with a single field of view.

26. The alignment method according to claim 21, wherein the second mark and the fourth mark are grating-pattern marks that generate a moire fringe, and the first object and the second object are aligned on the basis of a result of a mark detection detecting the moire fringe.

27. The alignment method according to claim 21, wherein the light includes a first light from the first mark, a second light from the second mark, a third light from the third mark and a fourth light from the fourth mark.

* * * * *